(12) United States Patent
Shirota et al.

(10) Patent No.: US 8,867,293 B2
(45) Date of Patent: Oct. 21, 2014

(54) SEMICONDUCTOR MEMORY DEVICE CHANGING REFRESH INTERVAL DEPENDING ON TEMPERATURE

(71) Applicant: Fujitsu Semiconductor Limited, Kanagawa (JP)

(72) Inventors: Akinobu Shirota, Date (JP); Kuninori Kawabata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/848,514

(22) Filed: Mar. 21, 2013

(65) Prior Publication Data

US 2013/0215700 A1 Aug. 22, 2013

Related U.S. Application Data

(60) Division of application No. 12/251,952, filed on Oct. 15, 2008, now Pat. No. 8,472,275, which is a division of application No. 11/713,029, filed on Mar. 2, 2007, now Pat. No. 7,453,754, which is a continuation of application No. 11/085,148, filed on Mar. 22, 2005, now Pat. No. 7,196,956, which is a continuation of application No. PCT/JP03/05201, filed on Apr. 23, 2003.

(51) Int. Cl.
| | |
|---|---|
| *G11C 7/00* | (2006.01) |
| *G11C 29/02* | (2006.01) |
| *G11C 11/406* | (2006.01) |
| *G11C 7/04* | (2006.01) |
| G11C 29/50 | (2006.01) |
| G11C 29/04 | (2006.01) |
| G11C 11/401 | (2006.01) |

(52) U.S. Cl.
CPC .......... *G11C 11/40626* (2013.01); *G11C 29/02* (2013.01); *G11C 2029/5002* (2013.01); *G11C 11/406* (2013.01); *G11C 2029/0409* (2013.01); *G11C 29/028* (2013.01); *G11C 2211/4061* (2013.01); *G11C 29/50016* (2013.01); *G11C 11/401* (2013.01); *G11C 7/04* (2013.01)
USPC .......................... 365/222; 365/211; 711/106

(58) Field of Classification Search
CPC ........... G11C 11/406; G11C 11/40626; G11C 2211/406; G11C 7/04
USPC .................................. 365/222, 211
See application file for complete search history.

(56) References Cited

U.S. PATENT DOCUMENTS

| | | | |
|---|---|---|---|
| 4,710,648 A | | 12/1987 | Hanamura et al. |
| 4,716,551 A | | 12/1987 | Inagaki |
| 5,375,093 A | * | 12/1994 | Hirano .......................... 365/222 |

(Continued)

FOREIGN PATENT DOCUMENTS

| | | |
|---|---|---|
| JP | 01116994 A | 5/1989 |
| JP | 07296582 A | 11/1995 |

*Primary Examiner* — Kretelia Graham
(74) *Attorney, Agent, or Firm* — Arent Fox LLP

(57) ABSTRACT

A semiconductor memory device includes a memory core circuit having memory cells for storing data, a circuit configured to refresh the memory core circuit at a refresh interval, a temperature detecting unit configured to detect temperature, and a control circuit configured to shorten the refresh interval immediately in response to detection of a predetermined temperature rise by the temperature detecting unit and to elongate the refresh interval after refreshing every one of the memory cells at least once in response to detection of a temperature drop by the temperature detecting unit.

2 Claims, 14 Drawing Sheets

(56) References Cited

U.S. PATENT DOCUMENTS

| | | | |
|---|---|---|---|
| 5,532,968 | A | 7/1996 | Lee |
| 5,784,328 | A | 7/1998 | Irrinki et al. |
| 6,094,705 | A | 7/2000 | Song |
| 6,134,167 | A * | 10/2000 | Atkinson ............ 365/222 |
| 6,438,057 | B1 | 8/2002 | Ruckerbauer |
| 6,446,159 | B2 | 9/2002 | Kai et al. |
| 6,667,925 | B2 | 12/2003 | Kobayashi et al. |
| 6,731,558 | B2 * | 5/2004 | Yamauchi et al. ............ 365/222 |
| 6,809,980 | B2 * | 10/2004 | Schnabel et al. ............ 365/222 |
| 6,928,512 | B2 * | 8/2005 | Ayukawa et al. ............ 711/105 |
| 2002/0191467 | A1 | 12/2002 | Matsumoto et al. |

\* cited by examiner

SEMICONDUCTOR MEMORY DEVICE CHANGING REFRESH INTERVAL DEPENDING ON TEMPERATURE

CROSS-REFERENCED TO RELATED APPLICATIONS

This is a Divisional Application which claims the benefit of U.S. patent application Ser. No. 12/251,952, filed Oct. 15, 2008, which claims the benefit of U.S. patent application Ser. No. 11/713,029 filed Mar. 2, 2007, which claims the benefit of U.S. patent application Ser. No. 11/085,148, filed Mar. 22, 2005, now U.S. Pat. No. 7,196,956, issued Mar. 27, 2007, which is a continuation of International Application No. PCT/JP2003/005201, filed on Apr. 23, 2003. The disclosures of the prior applications are hereby incorporated by reference in their entirety.

BACKGROUND OF THE INVENTION

1. Field of the Invention

The present invention generally relates to semiconductor memory devices, and particularly relates to a semiconductor memory device that performs a refresh operation for retaining data.

2. Description of the Related Art

The memory capacity required in mobile terminals such as cellular phones tends to increase as the functions of the terminals become increasingly sophisticated. Conventionally, SRAMs (static random access memories) have been used as memory devices in mobile terminals. In recent years, however, DRAMs (dynamic random access memories) have begun to be used for the purpose of providing a large memory capacity. What becomes a problem at such an attempt is the usable time of batteries in the mobile terminals.

SRAMs do not consume power for the purpose of retaining data. DRAMs, on the other hand, perform refresh operations at constant intervals to retain data, and consume power to some extent even in the standby state. Namely, even when mobile terminals are not in use, the holding of data in memory consumes electric power, resulting in the usable time of backup batteries being shortened.

In order to obviate this problem, the number of refresh operations in the standby state may be reduced so as to suppress power consumption. For example, the data retention time of DRAMs tends to increase as temperature drops. When temperature is low, therefore, the refresh intervals may be lengthened compared to when temperature is high, thereby reducing the number of refresh operations.

If the refresh intervals are controlled in response to the temperature detected by a temperature sensor in a straightforward manner, a problem as described in the following may arise.

A data retention time is short in the standby state if temperature is high. Refresh operations are thus performed at short intervals. If temperature suddenly drops from this condition, the memory cells that have been exposed to high temperature are automatically switched to long-interval refresh operations despite the fact that such memory cells need short-interval refresh operations. As a result, a refresh operation ends up failing to be completed within the time period necessary for data retention, resulting in a serious problem such as loss of data.

Accordingly, there is a need for a semiconductor memory device that is configured to adjust refresh intervals in response to temperature, and that can properly retain data even when a sudden temperature change occurs

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device, which includes a memory core circuit having memory cells for storing data, a circuit configured to refresh the memory core circuit at a refresh interval, a temperature detecting unit configured to detect temperature, and a control circuit configured to shorten the refresh interval immediately in response to detection of a predetermined temperature rise by the temperature detecting unit and to elongate the refresh interval after refreshing every one of the memory cells at least once in response to detection of a temperature drop by the temperature detecting unit.

According to at least one embodiment of the present invention, the refresh interval is not immediately changed in response to a transition from a high temperature state to a low temperature state. The refresh interval is changed to a longer interval after at least one cycle of refresh operation (at least one refresh for every memory cell) following the detection of such transition. Provision is thus made to avoid an undesirable event in which switching the refresh intervals to longer intervals causes destruction of data despite a need for shorter-interval refresh operations for the memory cells having been placed in the high temperature state.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
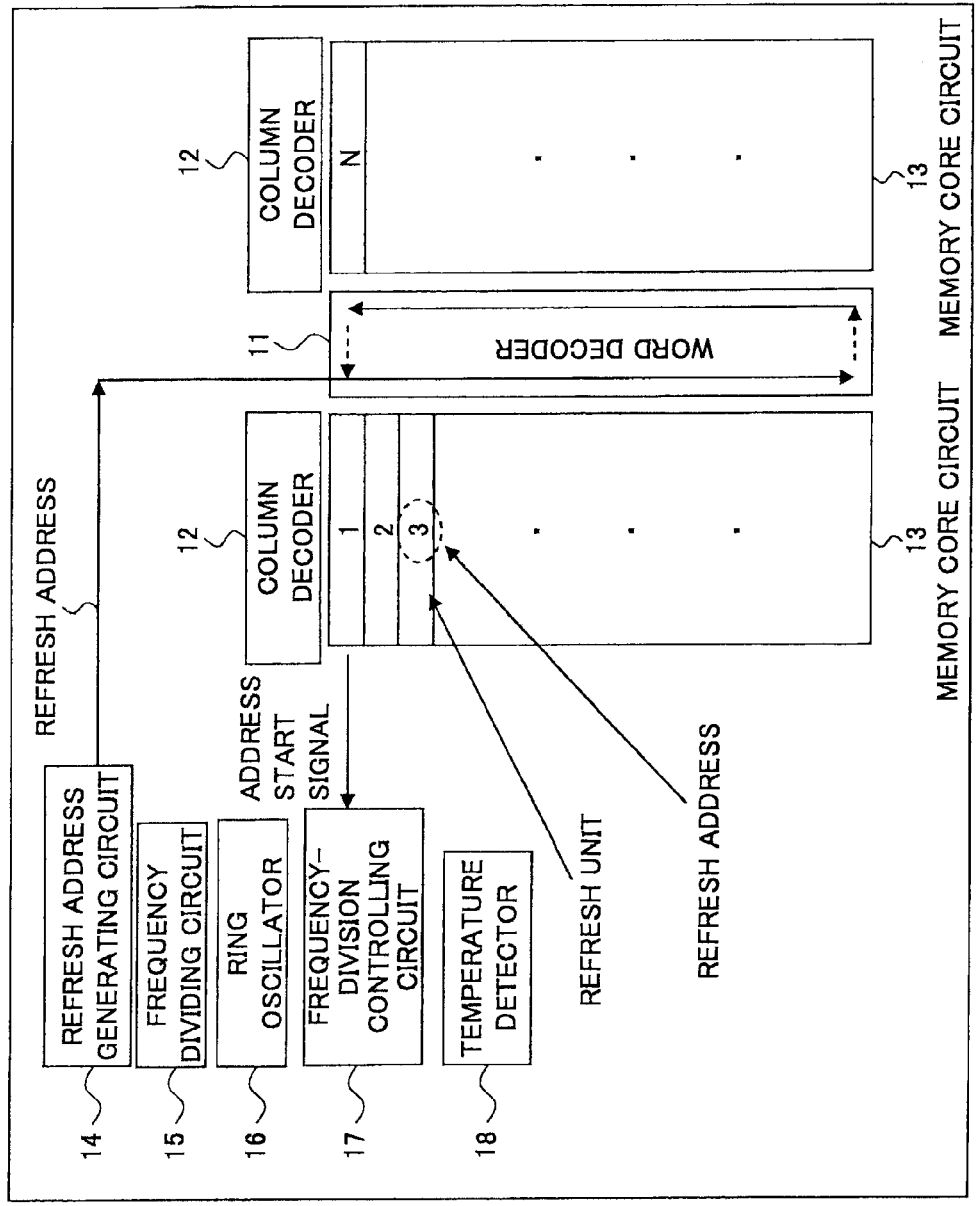
FIG. 1 is a drawing showing a schematic configuration of a first embodiment of a semiconductor memory device according to the present invention.

FIG. 1 is a drawing showing a schematic configuration of a first embodiment of a semiconductor memory device according to the present invention.

A semiconductor memory device 10 of FIG. 1 includes a word decoder 11, a column decoder 12, a memory core circuit 13, a refresh address generating circuit 14, a frequency dividing circuit 15, a ring oscillator 16, a frequency-division controlling circuit 17, and a temperature detector 18. The memory core circuit 13 is divided into two columns in FIG. 1, but may alternatively be arranged in one column or three or more columns. In the memory core circuit 13, a plurality of memory cells are arranged in matrix form having columns and rows, and a plurality of word lines, a plurality of bit lines, sense amplifiers, a plurality of column selecting lines, etc., are provided for the purpose of selecting memory cells at a specified address.

The word decoder 11 decodes a row address supplied from an exterior of the semiconductor memory device 10, and activates a word line indicated by the row address. Data of the memory cells connected to the activated word line are read to bit lines and amplified by the sense amplifiers. The column decoder 12 decodes a column address supplied from the exterior of the semiconductor memory device 10, and activates a column selecting line indicated by the column address. In the case of read operation, the data amplified by the sense amplifiers are selected by the activated column selecting line for provision as outputs to the exterior of the semiconductor memory device. In the case of write operation, write data is supplied from the exterior of the semiconductor memory device, and is written to the sense amplifiers at the column address selected by an activated column selecting line. The write data together with the data having been read from and to be written back to the memory cells are written to the memory cells connected to an activated word line.

In the case of refresh operation, a word line is selectively activated with respect to addresses requiring refreshing, and data of the memory cells connected to the selected word line are read to the bit lines. The sense amplifiers amplify data potentials on the bit lines. The amplified data are then written back to the memory cells connected to the selected word line. This is performed successively with respect to a series of refresh addresses (to refresh every memory cell once), which completes a refresh operation of one cycle.

Figure 2:
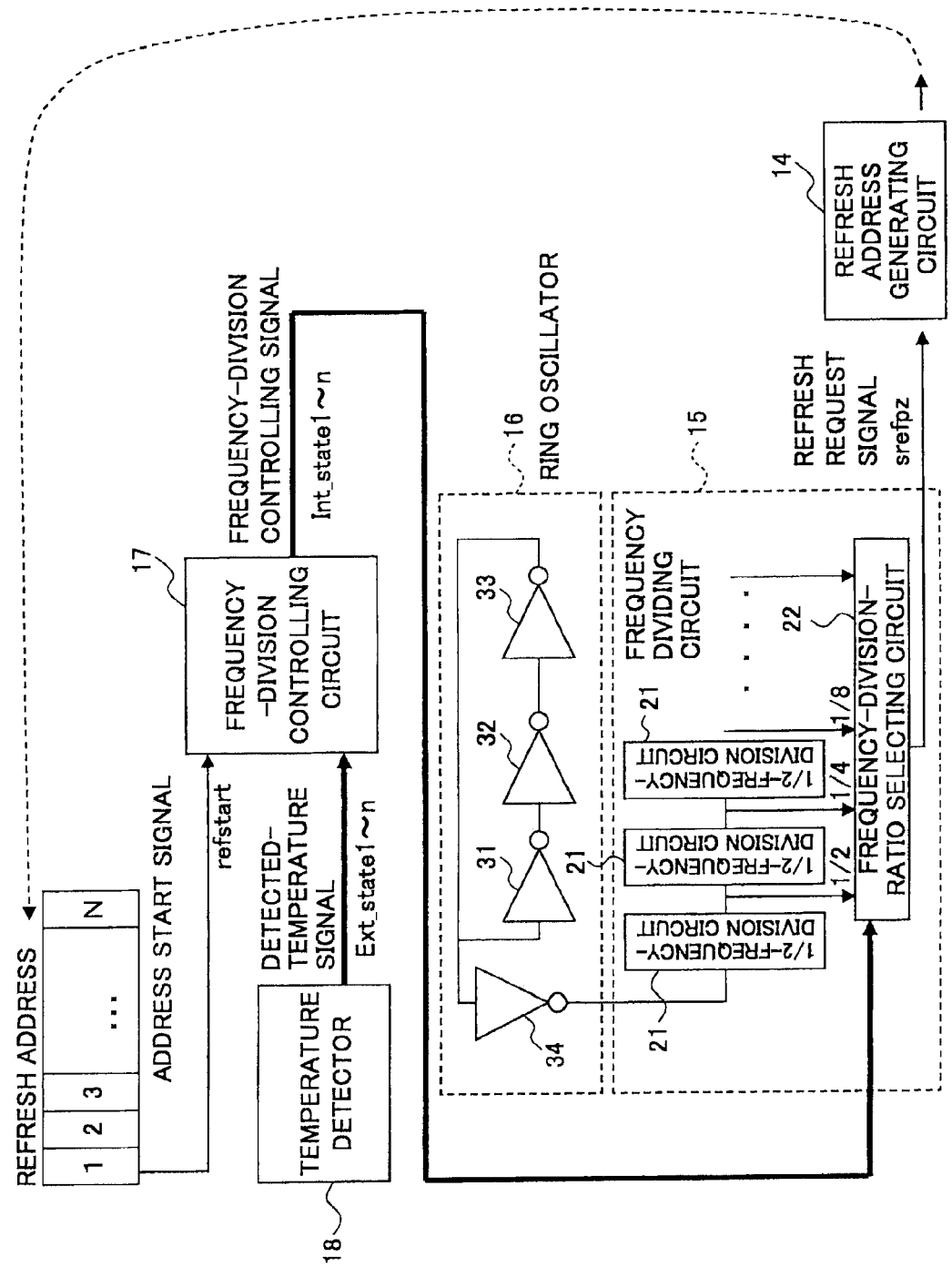
FIG. 2 is a drawing showing a construction for performing temperature-dependent refresh operations according to the present invention.

FIG. 2 is a drawing showing a construction for performing temperature-dependent refresh operations according to the present invention. FIG. 2 illustrates cross-connections between the refresh address generating circuit 14, the frequency dividing circuit 15, the ring oscillator 16, the frequency-division controlling circuit 17, and the temperature detector 18 shown in FIG. 1.

The temperature detector 18 detects temperature by use of a sensor, and supplies detected-temperature signals Ext_state1 through Ext_staten to the frequency-division controlling circuit 17. The detected-temperature signals Ext_state1 through Ext_staten each assume HIGH or LOW in accordance with comparison of the detected temperature with respective thresholds.

Figure 3:
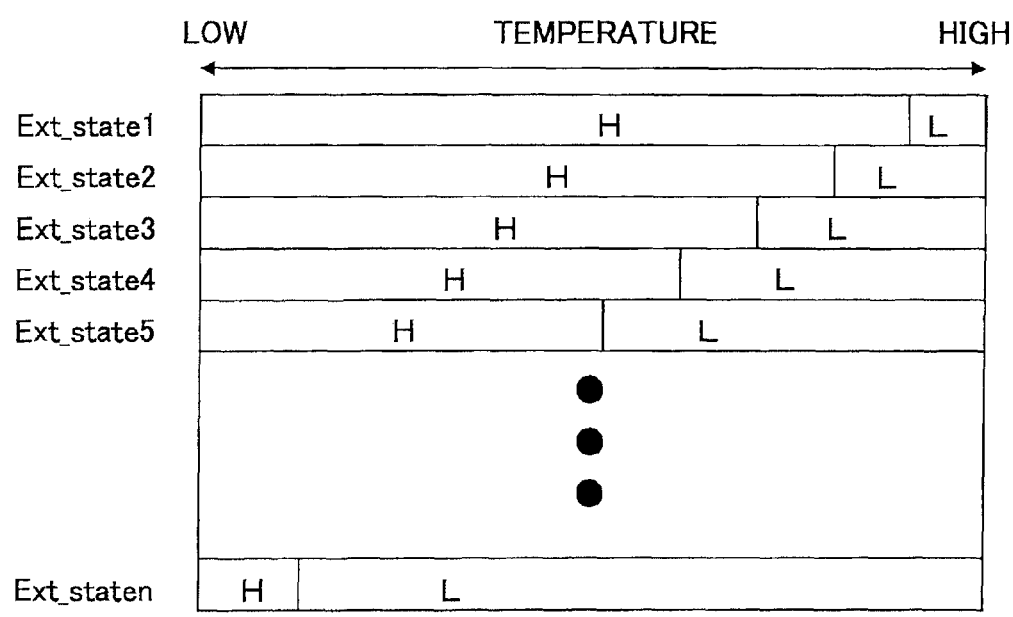
FIG. 3 is a diagram showing the relationship between temperature and detected-temperature signals.

FIG. 3 is a diagram showing the relationship between temperature and the detected-temperature signals Ext_state1 through Ext_staten. As shown in FIG. 3, all the detected-temperature signals Ext_state1 through Ext_staten are LOW when temperature is the highest. As temperature decreases, the detected-temperature signals Ext_state1 through Ext_staten successively become HIGH, stating from Ext_state1. When temperature is the lowest, all the detected-temperature signals Ext_state1 through Ext_staten are HIGH.

With reference to FIG. 2 again, the frequency-division controlling circuit 17 receives an address start signal refstart from the memory core circuit 13 (or from the word decoder 11). The address start signal refstart is asserted in response to selection of a start address at the start of a one-cycle refresh operation. The frequency-division controlling circuit 17 also receives the detected-temperature signals Ext_state1 through Ext_staten from the temperature detector 18. In response to the address start signal and the detected-temperature signals, the frequency-division controlling circuit 17 generates frequency-division controlling signals Int_state1 through Int_staten. The frequency-division controlling signals Int_state1 through Int_staten each become HIGH in response to the HIGH level of a corresponding one of the detected-temperature signals Ext_state1 through Ext_staten, thereby indicating a corresponding frequency-division ratio. The indicated frequency-division ratio determines refresh intervals. In the present invention, the refresh operation is not switched from shorter intervals to longer intervals immediately after a sudden temperature drop. Instead, the refresh operation is switched after waiting for a predetermined time period, which is achieved by controlling the transition timing of the frequency-division controlling signals Int_state1 through Int_staten.

The frequency-division controlling signals Int_state1 through Int_staten are supplied to the frequency dividing circuit 15. The frequency dividing circuit 15 includes a plurality of ½-frequency-division circuits 21 and a frequency-division-ratio selecting circuit 22. The frequency dividing circuit 15 receives a pulse signal that is an oscillation of the ring oscillator 16, and generates frequency-divided signals corresponding to ½ frequency division, ¼ frequency division, ⅛ frequency division, and so on by use of the ½-frequency-division circuits 21. The generated frequency-divided signals are supplied to the frequency-division-ratio selecting circuit 22. The frequency-division-ratio selecting circuit 22 selects a frequency-divided signal specified by the frequency-division controlling signals Int_state1 through Int_staten for provision as a refresh request signal srefpz to the refresh address generating circuit 14.

The ring oscillator 16 includes inverters 31 through 34. The inverters 31 through 34 make up a loop, thereby oscillating to generate a pulse signal having a predetermined cycle. The oscillated signal is supplied to the frequency dividing circuit 15 via the inverter 34.

The refresh address generating circuit 14 successively generates individual refresh addresses in response to the individual pulses of the refresh request signal srefpz. The refresh addresses successively generated by the refresh address generating circuit 14 are supplied to the word decoder 11 of FIG. 1, thereby performing a refresh operation with respect to each of the refresh addresses. When a refresh operation is performed once for every one of the memory cells, a one-cycle refresh operation is completed. In this manner, the length of the refresh intervals is determined according to the length of the pulse cycle of the refresh request signal srefpz.

Figure 4:
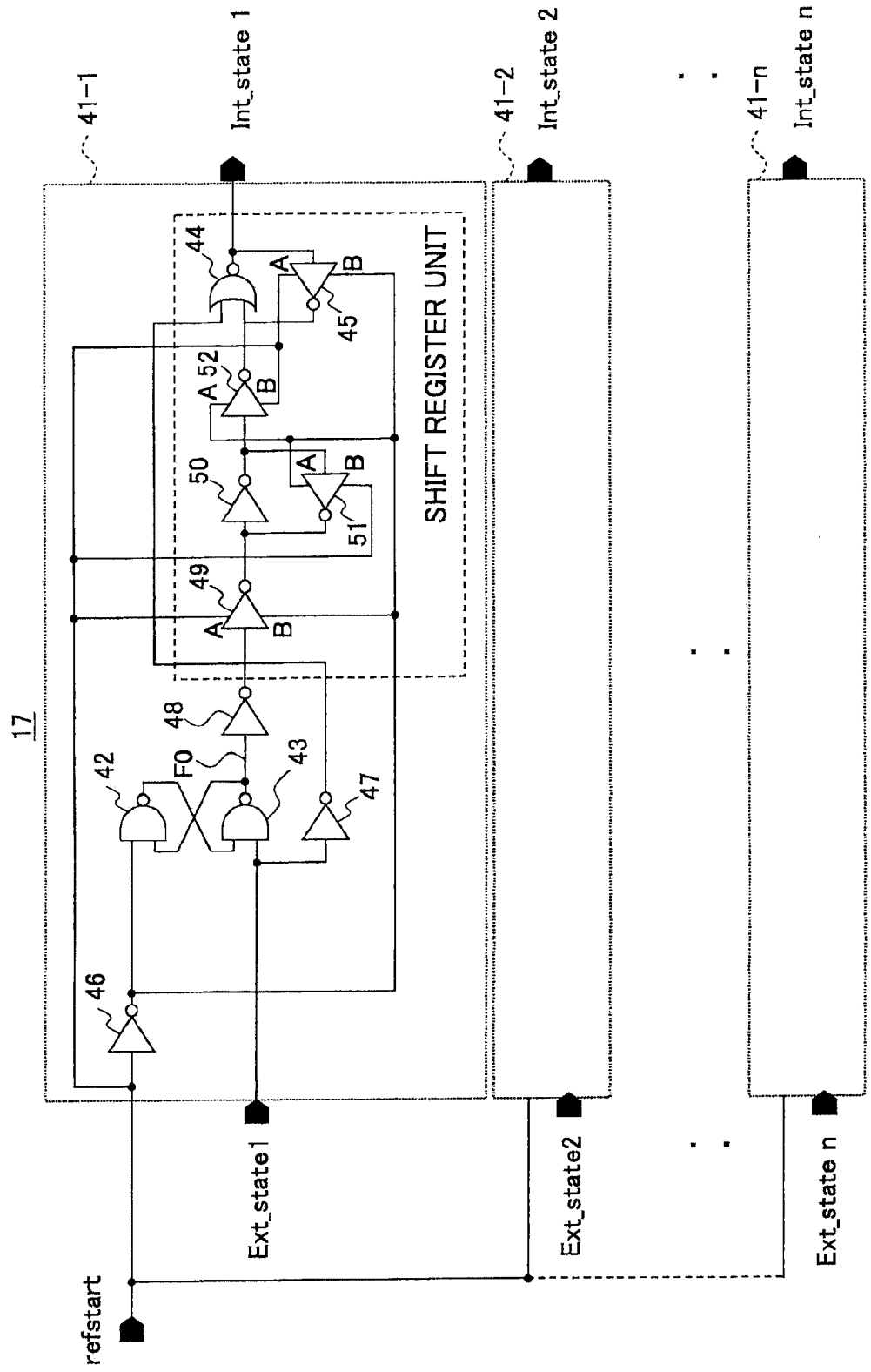
FIG. 4 is a drawing showing an example of the construction of a frequency-division controlling circuit.

FIG. 4 is a drawing showing an example of the construction of the frequency-division controlling circuit 17.

The frequency-division controlling circuit 17 includes a plurality of frequency-division controlling signal generating circuits 41-1 through 41-n. The frequency-division controlling signal generating circuits 41-1 through 41-n change the respective frequency-division controlling signals Int_state1 through Int_staten to HIGH in response to a change to HIGH in the respective detected-temperature signals Ext_state1 through Ext_staten. The timing at which the frequency-division controlling signals Int_state1 through Int_staten are generated is controlled by the address start signal refstart.

FIG. 4 illustrates only the construction of the frequency-division controlling signal generating circuit 41-1. The other frequency-division controlling signal generating circuits 41-2 through 41-n have the same construction as the frequency-division controlling signal generating circuit 41-1. The frequency-division controlling signal generating circuit 41-1 includes NAND gates 42 and 43, a NOR gate 44, and inverters 45 through 52. Here, the inverters 45, 49, 51, and 52 are provided with a gate function, and operate as an inverter to allow the passage of a signal only when the A input is LOW and the B input is HIGH. The NAND gates 42 and 43 together form a flip-flop having an output FO. The NOR gate 44 and the inverters 45 and 49-52 together form a shift register unit, in which the inverters 50 and 51 constitute a first latch, and the NOR gate 44 and the inverter 45 constitute a second latch.

In the initial state, the address start signal refstart and the detected-temperature signal Ext_state1 are LOW. The output FO of the flip-flop is thus HIGH. Also, the frequency-division controlling signal Int_state1 is LOW. A case will be examined below in which the detected-temperature signal Ext_state1 changes to HIGH in response to a temperature drop. Even when the detected-temperature signal Ext_state1 changes to HIGH, the output FO of the flip-flop does not exhibit an immediate change, but stays HIGH. When the address start signal refstart becomes HIGH thereafter, the flip-flop output FO turns to LOW in response. As the address start signal refstart returns to LOW, the inverter 49 is activated, so that the output of the inverter 50 becomes HIGH. At this time, the inverter 52 is blocking the output of the inverter 50.

At the next refresh sequence, the address start signal refstart changes to HIGH again. In response, the inverter 52 allows the signal to pass therethrough, so that the frequency-division controlling signal Int_state1 becomes HIGH. This state is latched by the second latch of the shift resister unit.

Figure 5:
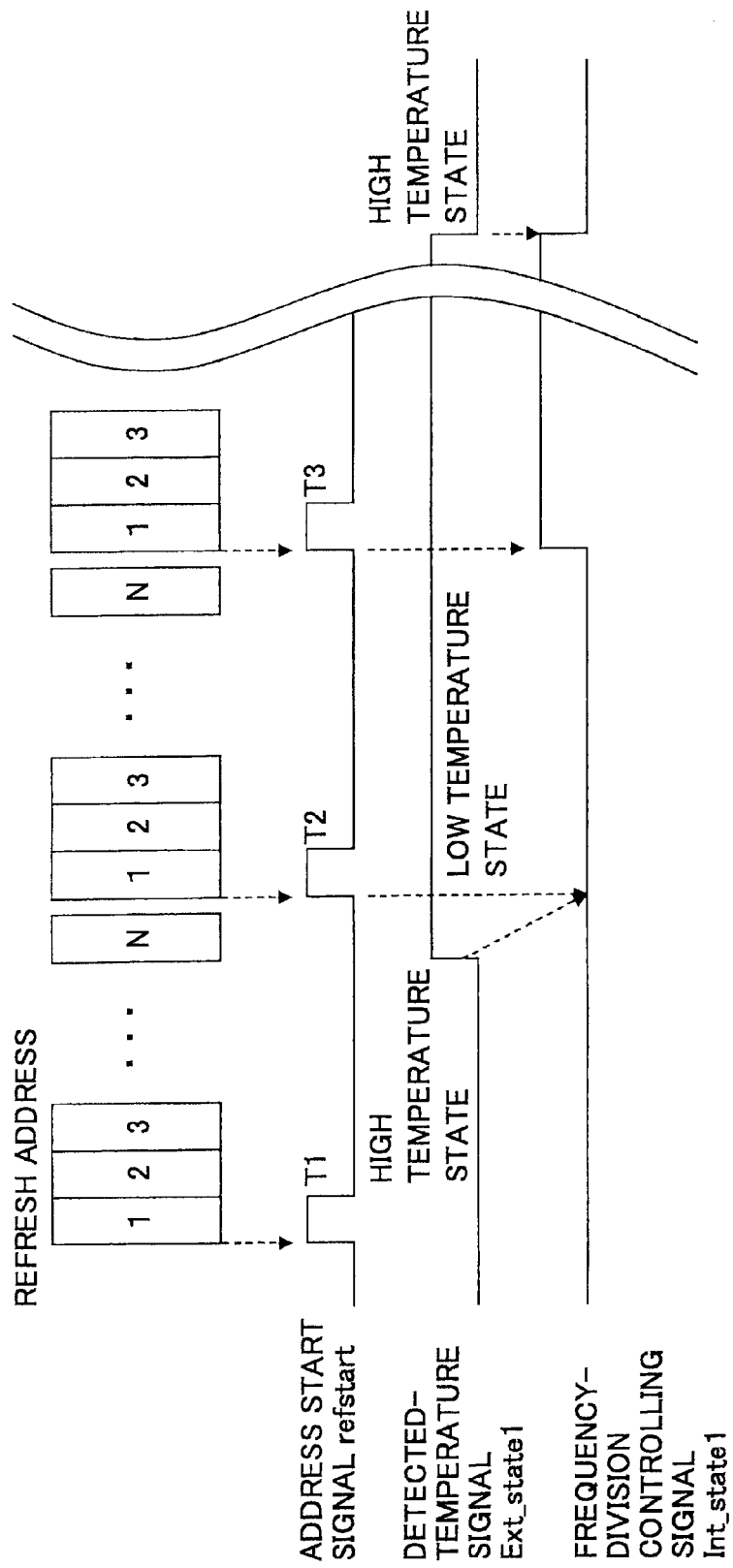
FIG. 5 is a timing chart for explaining the operation of a frequency-division controlling signal generating circuit.

FIG. 5 is a timing chart for explaining the operation of the frequency-division controlling signal generating circuit 41-1.

When the address start signal refstart becomes HIGH at timing T1, the detected-temperature signal Ext_state1 is LOW due to a high temperature condition. A transition occurs thereafter from the high temperature condition to a low temperature condition, which results in the detected-temperature signal Ext_state1 changing to HIGH. At this time, however, the frequency-division controlling signal Int_state1 stays LOW. Even when the address start signal refstart becomes HIGh at timing T2 after the transition from the high temperature state to the low temperature state, the frequency-division controlling signal Int_state1 does not change.

Thereafter, the refresh operation for one cycle is completed, and the address start signal refstart changes to HIGH again at timing T3. In response to this, the frequency-division controlling signal Int_state1 changes to HIGH. When a transition from the low temperature state to a high temperature state occurs thereafter, the frequency-division controlling signal Int_state1 changes to LOW immediately in response to the change to LOW of the detected-temperature signal Ext_state1.

In the present invention as described above, the refresh intervals are not immediately changed in response to a transition from a high temperature state to a low temperature state. The refresh intervals are changed to longer intervals after at least one cycle of refresh operation (at least one refresh for every memory cell) following the detection of such transition. Provision is thus made to avoid an undesirable event in which switching the refresh intervals to longer intervals causes destruction of data despite a need for shorter-interval refresh operations for the memory cells having been placed in the high temperature state.

Figure 6:
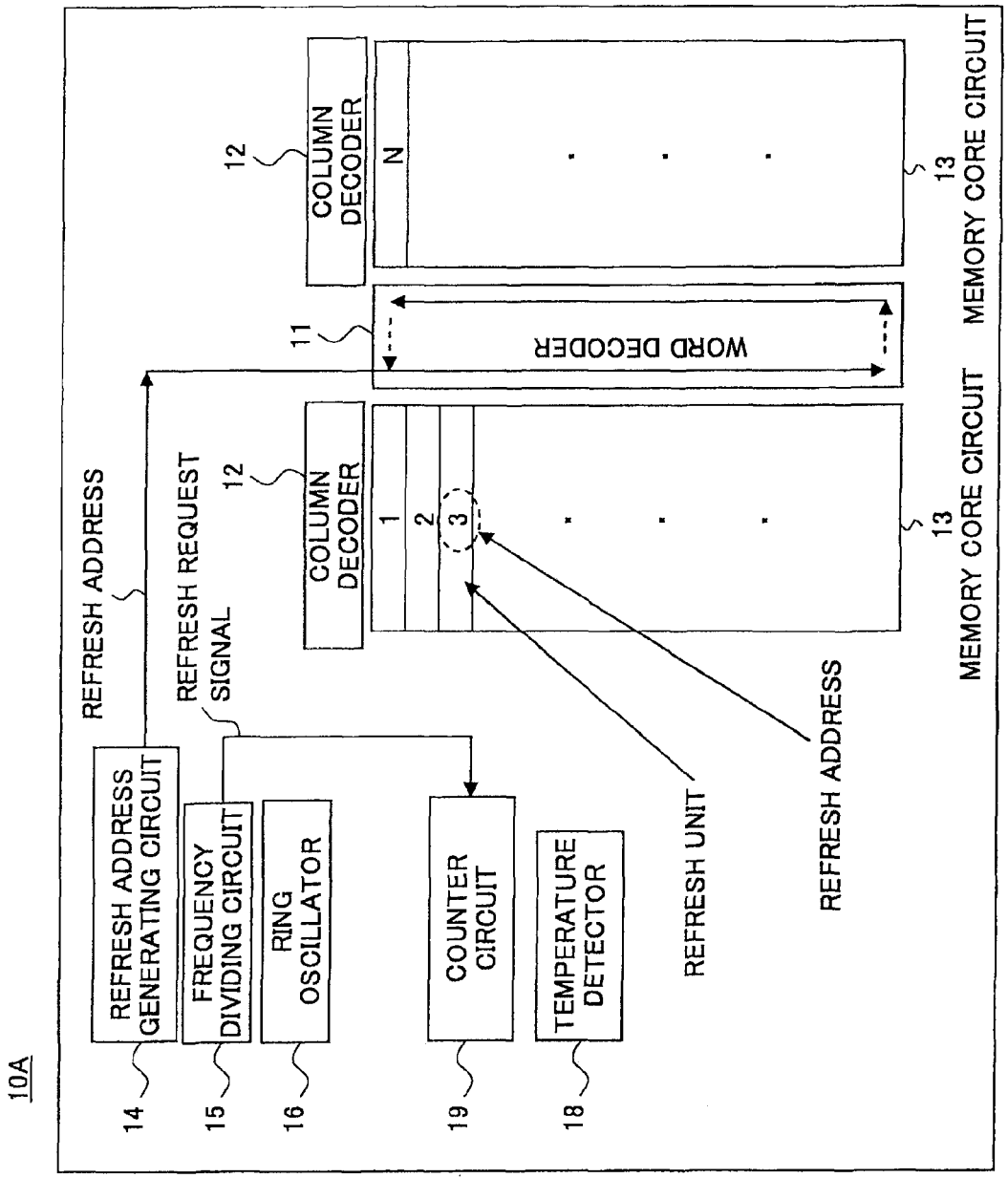
FIG. 6 is a drawing showing a schematic configuration of a second embodiment of the semiconductor memory device according to the present invention.

FIG. 6 is a drawing showing a schematic configuration of a second embodiment of the semiconductor memory device according to the present invention. In FIG. 6, the same elements as those of FIG. 1 are referred to by the same numerals, and a description thereof will be omitted.

In a semiconductor memory device 10A according to the second embodiment shown in FIG. 6, a counter circuit 19 is provided in place of the frequency-division controlling circuit 17 provided in the semiconductor memory device 10 of FIG. 1. The counter circuit 19 receives a refresh request signal generated by the frequency dividing circuit 15, and counts the number of refresh request signals. When the temperature detector 18 detects a transition from a high temperature state to a low temperature state, the counter circuit 19 starts counting. The refresh intervals are changed after the count reaches a predetermined value.

Figure 7:
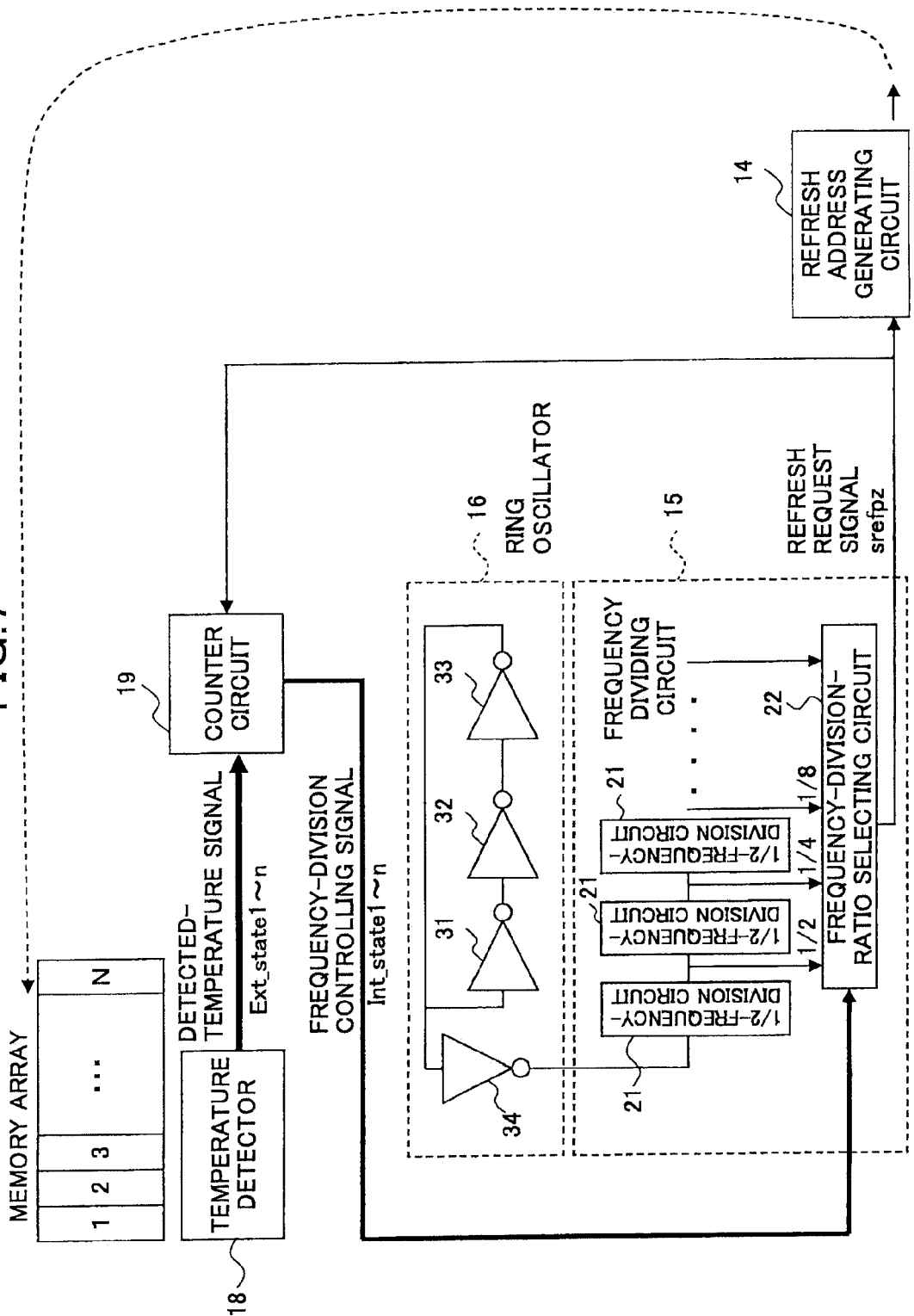
FIG. 7 is a drawing showing the construction for performing temperature-dependent refresh operations according to the present invention.

FIG. 7 is a drawing showing the construction for performing temperature-dependent refresh operations according to the present invention. In FIG. 7, the same elements as those of FIG. 2 are referred to by the same numerals, and a description thereof will be omitted.

FIG. 7 illustrates cross-connections between the refresh address generating circuit 14, the frequency dividing circuit 15, the ring oscillator 16, the temperature detector 18, and the counter circuit 19 shown in FIG. 6. As shown in FIG. 7, the refresh request signal srefpz generated by the frequency dividing circuit 15 is supplied to the refresh address generating circuit 14, and is also supplied to the counter circuit 19. The counter circuit 19 further receives the detected-temperature signals Ext_state1 through Ext_staten from the temperature detector 18. When changes in the detected-temperature signals Ext_state1 through Ext_staten indicate a temperature drop, the counter circuit 19 starts counting the refresh request signal srefpz. Upon the count reaching a predetermined value, the counter circuit 19 changes the frequency-division controlling signals Int_state1 through Int_staten. When changes in the detected-temperature signals Ext_state1 through Ext_staten indicate a temperature rise, the counter circuit 19 immediately changes the frequency-division controlling signals Int_state1 through Int_staten.

Figure 8A:
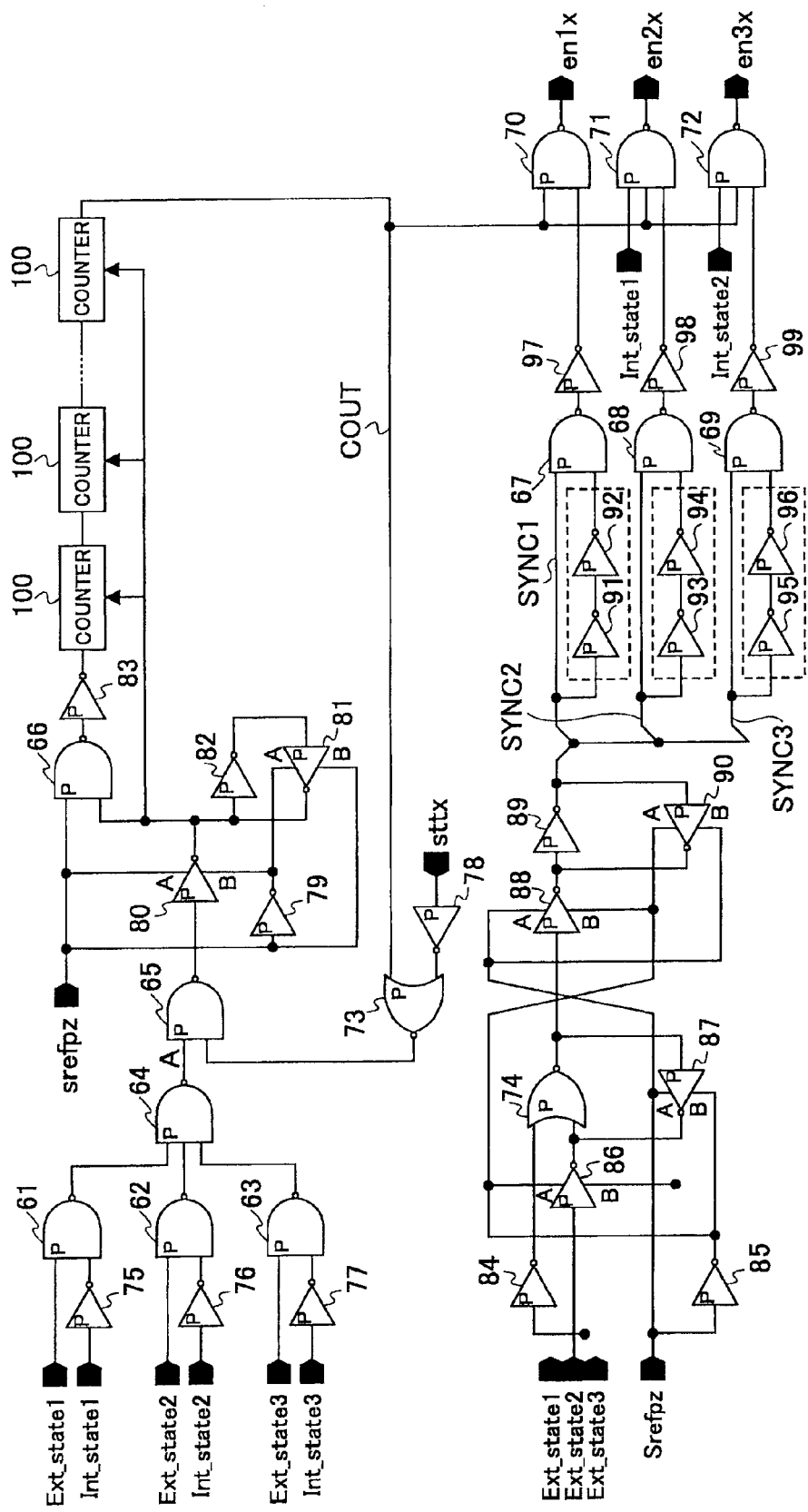
FIGS. 8A and 8B are drawings showing an example of the circuit construction of a counter circuit.
Figure 8B:
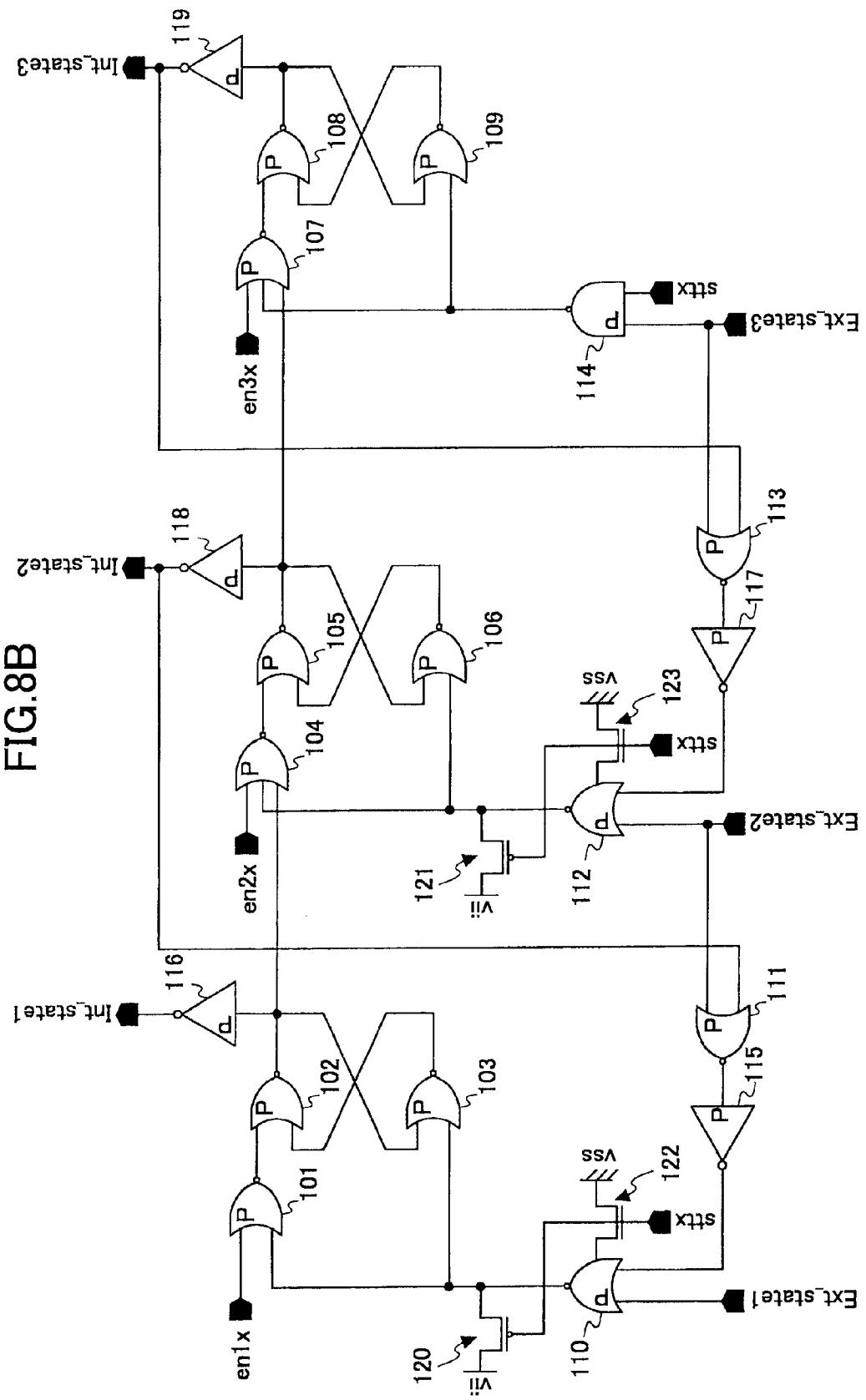

FIGS. 8A and 8B are drawings showing an example of the circuit construction of the counter circuit 19. For the sake of simplicity of explanation, three detected-temperature signals Ext_state1 through Ext_state3 are provided in this example for detection of a temperature change with respect to four different temperature ranges.

FIG. 8A shows the circuit portion of the counter circuit 19 for counting the refresh request signal srefpz. This circuit portion includes NAND gates 61 through 72, NOR gates 73 and 74, inverters 75 through 99, and a counter 100. The NAND gates 61 through 63 constitute a circuit portion for detecting a temperature drop. When a transition from a high temperature state to a low temperature state occurs, one of the detected-temperature signals Ext_state1 through Ext_state3 becomes HIGH with respect to one of the LOW signals among the frequency-division controlling signals Int_state1 through Int_state3. As a result, a corresponding one of the outputs of the NAND gates 61 through 63 changes to HIGH. In response, the NAND gate 66 allows the refresh request signal srefpz to pass therethrough. Accordingly, the counter 100 starts counting the refresh request signal srefpz.

When a counter output COUT becomes HIGH upon the count reaching the predetermined value, one of the outputs en1x through en3x of the NAND gates 70 through 72, corresponding to the detected-temperature signal that has become HIGH, changes to LOW. In FIG. 8A, a signal sttx is a reset signal, which resets the counter 100 as it changes to LOW.

FIG. 8B shows the circuit portion of the counter circuit 19 for generating the frequency-division controlling signals Int_state1 through Int_state3.

The circuit portion of FIG. 8B includes NOR gates 101 through 113, a NAND gate 114, inverters 115 through 119, PMOS transistors 120 and 121, and NMOS transistors 122 and 123. When a transition from high temperature to low temperature occurs, the detected-temperature signal Ext_state2 becomes HIGH, for example. This results in the output of the NOR gate 112 changing from HIGH to LOW. At this point in time, a flip-flop comprised of the NOR gates 105 and 106 does not change its state. When the count thereafter becomes the predetermined value, the signal en2x changes from HIGH to LOW, resulting in the output of the NOR gate 104 changing from LOW to HIGH. In response, the flip-flop comprised of the NOR gates 105 and 106 changes its state, so that the frequency-division controlling signal Int_state2 is changed to HIGH.

When a transition from low temperature to high temperature occurs, the detected-temperature signal Ext_state2 becomes LOW, for example. The output of the NOR gate 112 thus changes from LOW to HIGH. In response, the flip-flop comprised of the NOR gates 105 and 106 changes its state immediately, so that the frequency-division controlling signal Int_state2 is changed to LOW.

Figure 9:
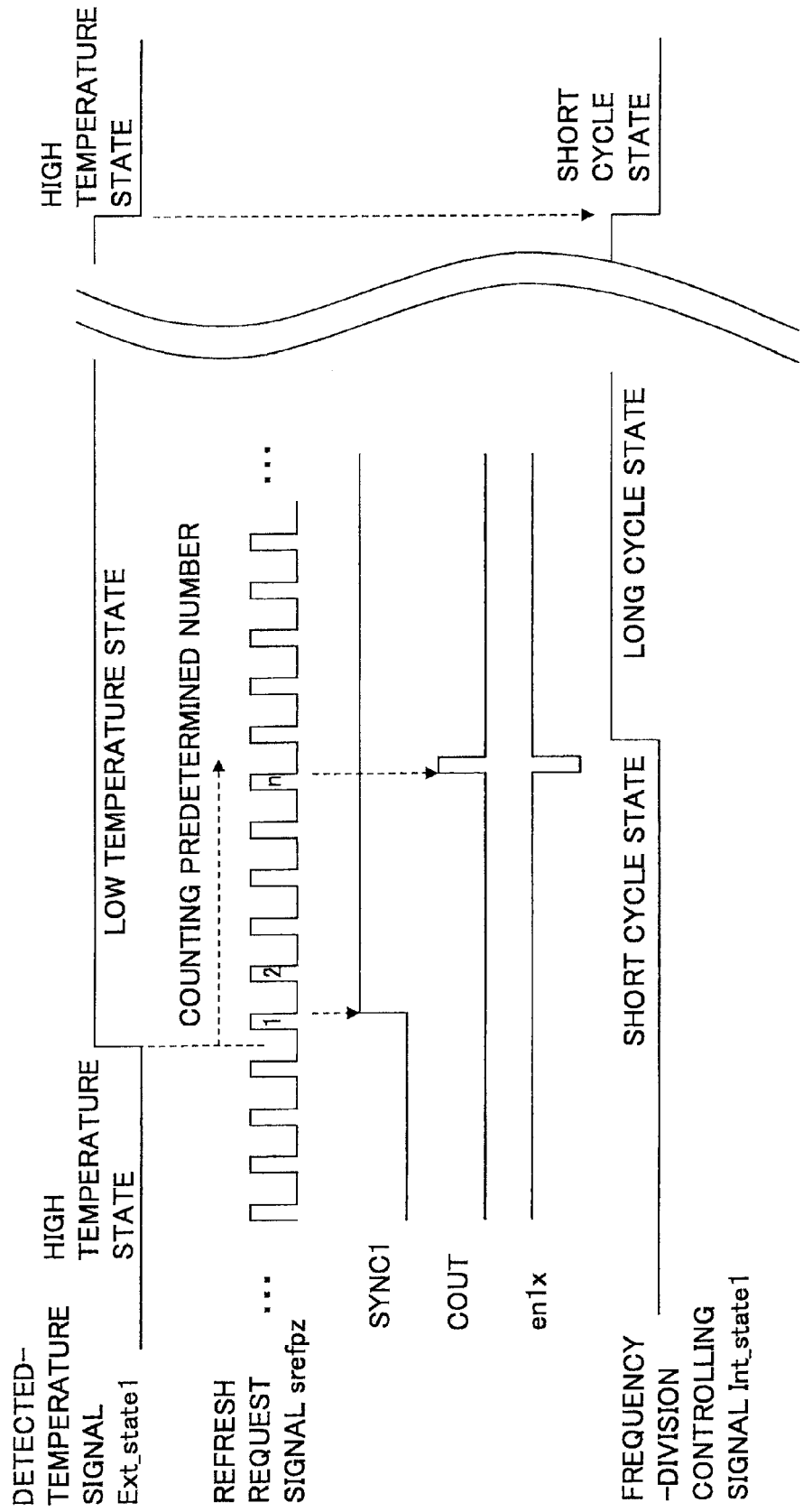
FIG. 9 is a timing chart for explaining an operation of generating frequency-division controlling signals.

FIG. 9 is a timing chart for explaining the operation of generating frequency-division controlling signals.

The detected-temperature signal Ext_state1 changes to HIGH upon a transition from a high temperature state to a low temperature state. Despite this, the frequency-division controlling signal Int_state1 stays LOW. The change to HIGH of the detected-temperature signal Ext_state1, however, prompts the counting of the address start signal refstart to be started. After this, a signal SYNC1 shown in FIG. 8A becomes HIGH as a signal corresponding to the detected-temperature signal Ext_state1 in synchronization with the refresh request signal srefpz (SYNC1 through SYNC3 correspond to Ext_state1 through Ext_state3, respectively, in FIG. 8A). When the count reaches a predetermined value n, the counter output signal COUT shown in FIG. 8A becomes HIGH. In response, the signal en1x temporarily becomes LOW.

As the signal en1x temporarily stays LOW, the flip-flop comprised of the NOR gates 102 and 103 shown in FIG. 8B inverts its state, so that the frequency-division controlling signal Int_state1 changes to HIGH. As a result, the refresh operation switches from shorter intervals to longer intervals.

When a transition from a low temperature state to a high temperature state occurs thereafter, the frequency-division controlling signal Int_state1 immediately changes to LOW in response to a change to LOW in the detected-temperature signal Ext_state1.

In the present invention as described above, the refresh intervals are not immediately changed in response to a transition from a high temperature state to a low temperature state. The refresh intervals are changed to longer intervals after counting a predetermined number of occurrences of the refresh request signal following the detection of such a transition. In so doing, it is preferable to count the refresh request signals as many as the number corresponding to at least one cycle of refresh operation (at least one refresh for every memory cell). Provision is thus made to avoid an undesirable event in which switching the refresh intervals to longer intervals causes destruction of data despite a need for shorter-interval refresh operations for the memory cells having been placed in the high temperature state.

The configuration is not limited to provide one cycle of refresh operation. Provision may alternatively be made to change the refresh intervals to longer intervals after counting the refresh request signals as many as the number corresponding to two or more cycles of refresh operations.

Figure 10:
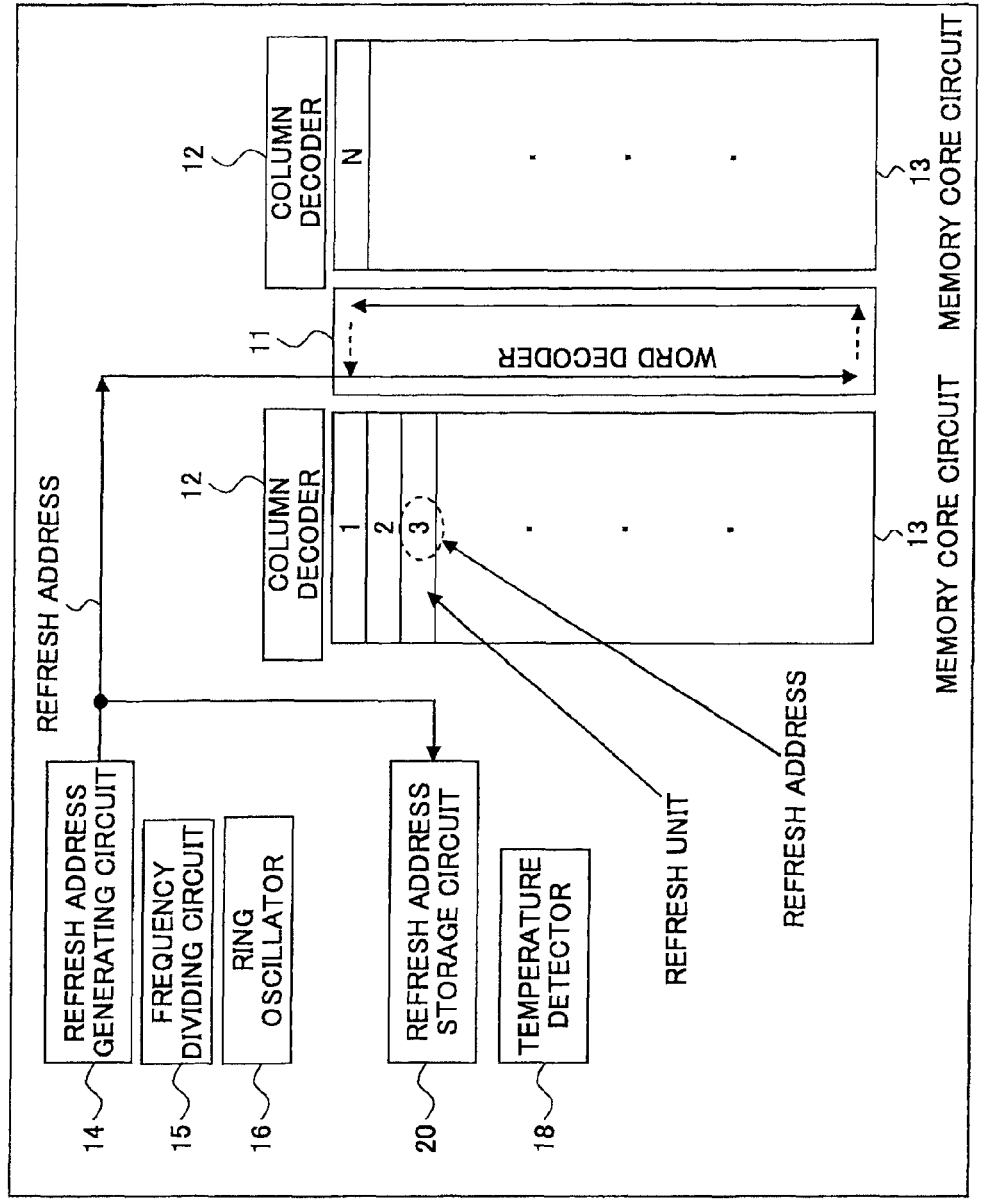
FIG. 10 is a drawing showing a schematic construction of a third embodiment of the semiconductor memory device according to the present invention.

FIG. 10 is a drawing showing a schematic construction of a third embodiment of the semiconductor memory device according to the present invention. In FIG. 10, the same elements as those of FIG. 1 are referred to by the same numerals, and a description thereof will be omitted.

In a semiconductor memory device 10B of the third embodiment shown in FIG. 10, a refresh address storage circuit 20 for storing a refresh address is provided in place of the frequency-division controlling circuit 17 provided in the semiconductor memory device 10 of FIG. 1. The refresh address storage circuit 20 successively receives refresh addresses generated by the refresh address generating circuit 14. The refresh address storage circuit 20 stores a current refresh address in an internal latch when the temperature detector 18 detects a transition from a high temperature state to a low temperature state. The refresh address storage circuit 20 compares a series of refresh addresses successively supplied thereafter with the refresh address of the internal latch to check whether they match. When this check finds a match of refresh addresses, the refresh intervals are changed.

Figure 11:
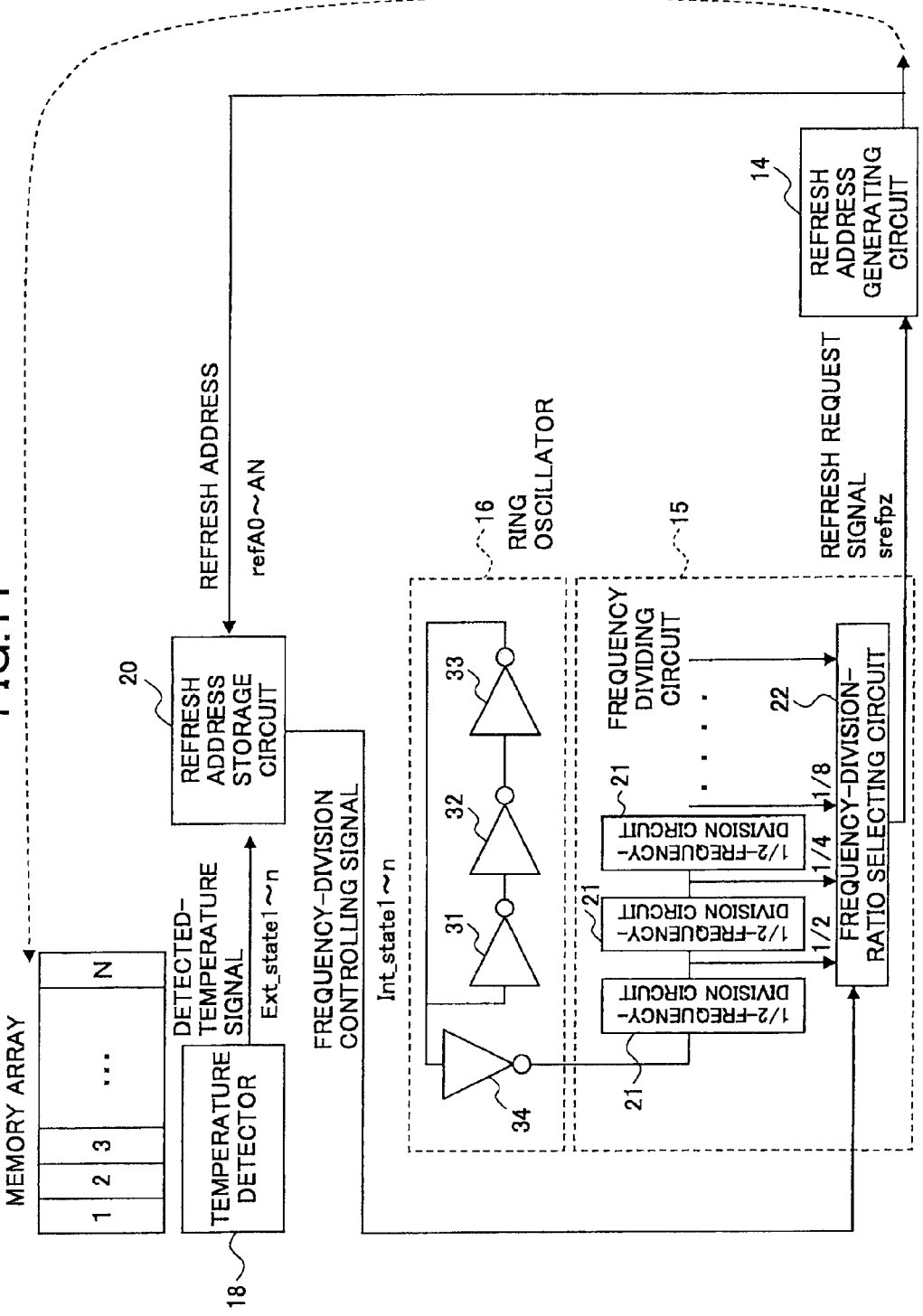
FIG. 11 is a drawing showing the construction for performing temperature-dependent refresh operations according to the present invention.

FIG. 11 is a drawing showing the construction for performing temperature-dependent refresh operations according to the present invention. In FIG. 11, the same elements as those of FIG. 2 are referred to by the same numerals, and a description thereof will be omitted.

FIG. 11 shows cross-connections between the refresh address generating circuit 14, the frequency dividing circuit 15, the ring oscillator 16, the temperature detector 18, and the refresh address storage circuit 20, shown in FIG. 10. As shown in FIG. 11, the refresh addresses generated by the refresh address generating circuit 14 are supplied to the refresh address storage circuit 20. The refresh address storage circuit 20 further receives the detected-temperature signals Ext_state1 through Ext_staten from the temperature detector 18. When changes in the detected-temperature signals Ext_state1 through Ext_staten indicate a temperature drop, the refresh address storage circuit 20 stores a refresh address being supplied at that moment in the internal latch. After this, the refresh address storage circuit 20 successively compares the supplied refresh addresses with the refresh address stored in the internal latch. When the comparison indicates a match, the refresh address storage circuit 20 changes the frequency-division controlling signals Int_state1 through Int_staten accordingly. When changes in the detected-temperature signals Ext_state1 through Ext_staten indicate a temperature rise, the frequency-division controlling signals Int_state1 through Int_staten are changed immediately.

Figure 12:
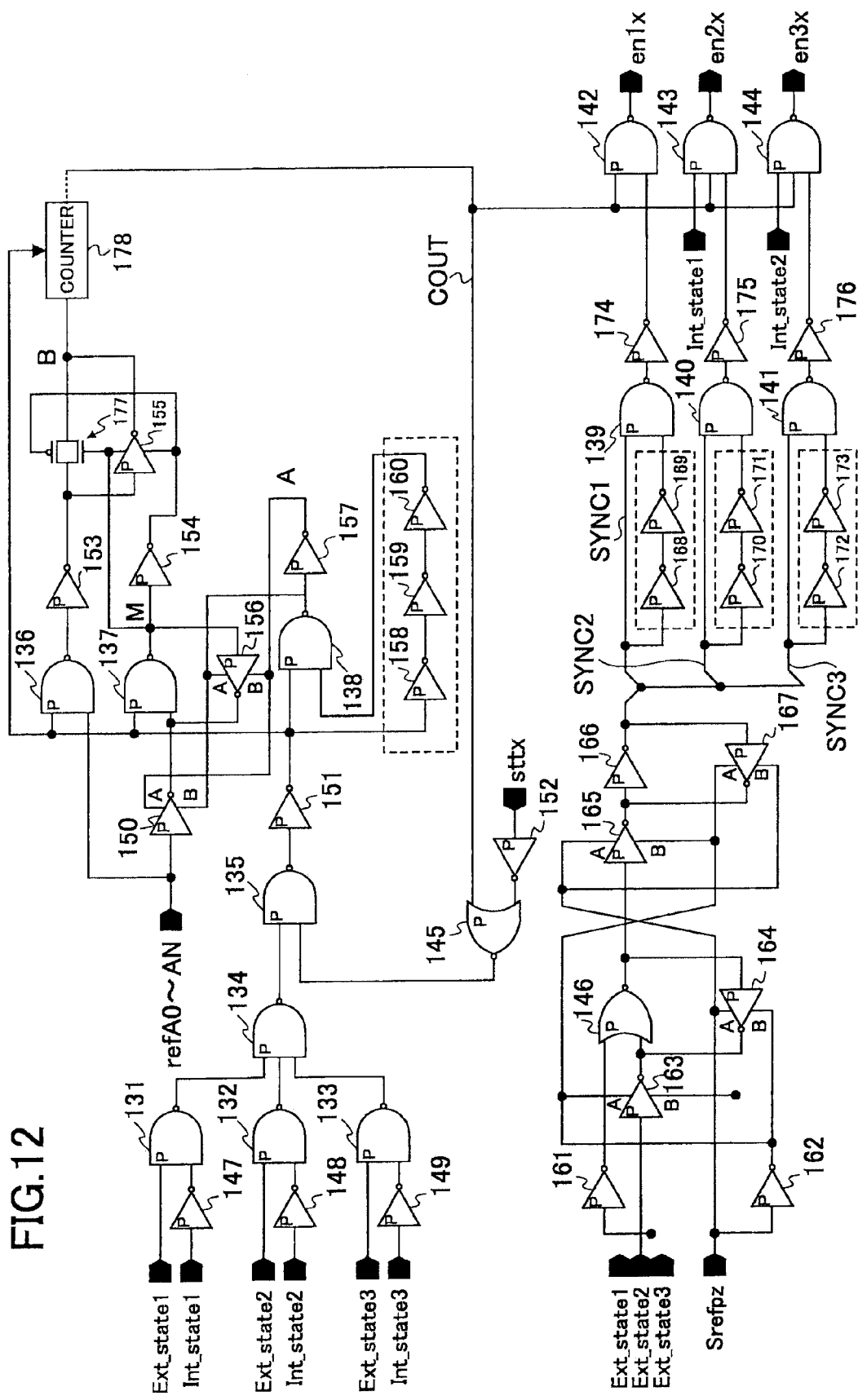
FIG. 12 is a drawing showing an example of the circuit construction of a refresh address storage circuit.

FIG. 12 is a drawing showing an example of the circuit construction of the refresh address storage circuit 20.

For the sake of simplicity of explanation, three detected-temperature signals Ext_state1 through Ext_state3 are provided in this example for detection of a temperature change with respect to four different temperature ranges. FIG. 12 shows the circuit portion of the refresh address storage circuit 20 for comparing refresh addresses, but does not illustrate the portion for generating the frequency-division controlling signals Int_state1 through Int_staten. The portion for generating the frequency-division controlling signals Int_state1 through Int_staten is the same as the circuit construction shown in FIG. 8B.

The circuit shown in FIG. 12 includes NAND gates 131 through 144, NOR gates 145 and 146, inverters 147 through 176, a transfer gate 177, and a counter 178. The NAND gates 131 through 133 constitute a circuit portion for detecting a temperature drop. When a transition from a high temperature state to a low temperature state occurs, one of the detected-temperature signals Ext_state1 through Ext_state3 becomes HIGH with respect to one of the LOW signals among the frequency-division controlling signals Int_state1 through Int_state3. As a result, a corresponding one of the outputs of the NAND gates 131 through 133 changes to HIGH. In response, a signal at a node A becomes HIGH, which deactivates the inverter 150 and activates the inverter 156. As a result, a latch comprised of the inverter 156 and the NAND gate 137 stores the current refresh address at its node M.

Refresh addresses thereafter received are supplied to the transfer gate 177 and to the inverter 155. If the address M stored by the latch is HIGH, the transfer gate 177 is open. If the refresh address being supplied at that moment is HIGH, then, a node B becomes HIGH. If the address M stored by the latch is LOW, the inverter 155 is open. If the refresh address being supplied at that moment is LOW, then, the node B becomes HIGH. Namely, the node B becomes HIGH when the refresh address being supplied matches the address stored in the latch.

It should be noted that the circuit portion for storing a refresh address in the latch and the circuit portion for comparing a refresh address being supplied with a refresh address stored in the latch are provided separately for each of the refresh address bits refA0 through refAN. When the refresh address (refA0 through refAN) being supplied matches the address stored in the latch, the counter 178 performs a count-up operation. When the output COUT of the counter 178 becomes HIGH, one of the outputs en1x through en3x of the NAND gates 142 through 144, corresponding to the detected-temperature signal that has become HIGH, changes to LOW. In FIG. 12, a signal sttx is a reset signal.

The circuit for generating the frequency-division controlling signals Int_state1 through Int_state3 based on the signals en1x through en3x is the same as the circuit of FIG. 8B. With reference to FIG. 8B, when a transition from high temperature to low temperature occurs, the detected-temperature signal Ext_state2 becomes HIGH, for example. This results in the output of the NOR gate 112 changing from HIGH to LOW. When the signal en2x changes from HIGH to LOW thereafter, the flip-flop comprised of the NOR gates 105 and 106 changes its state, so that the frequency-division controlling signal Int_state2 is changed to HIGH.

When a transition from low temperature to high temperature occurs, the detected-temperature signal Ext_state2 becomes LOW, for example. The output of the NOR gate 112 thus changes from LOW to HIGH. In response, the flip-flop comprised of the NOR gates 105 and 106 changes its state immediately, so that the frequency-division controlling signal Int_state2 is changed to LOW.

Figure 13:
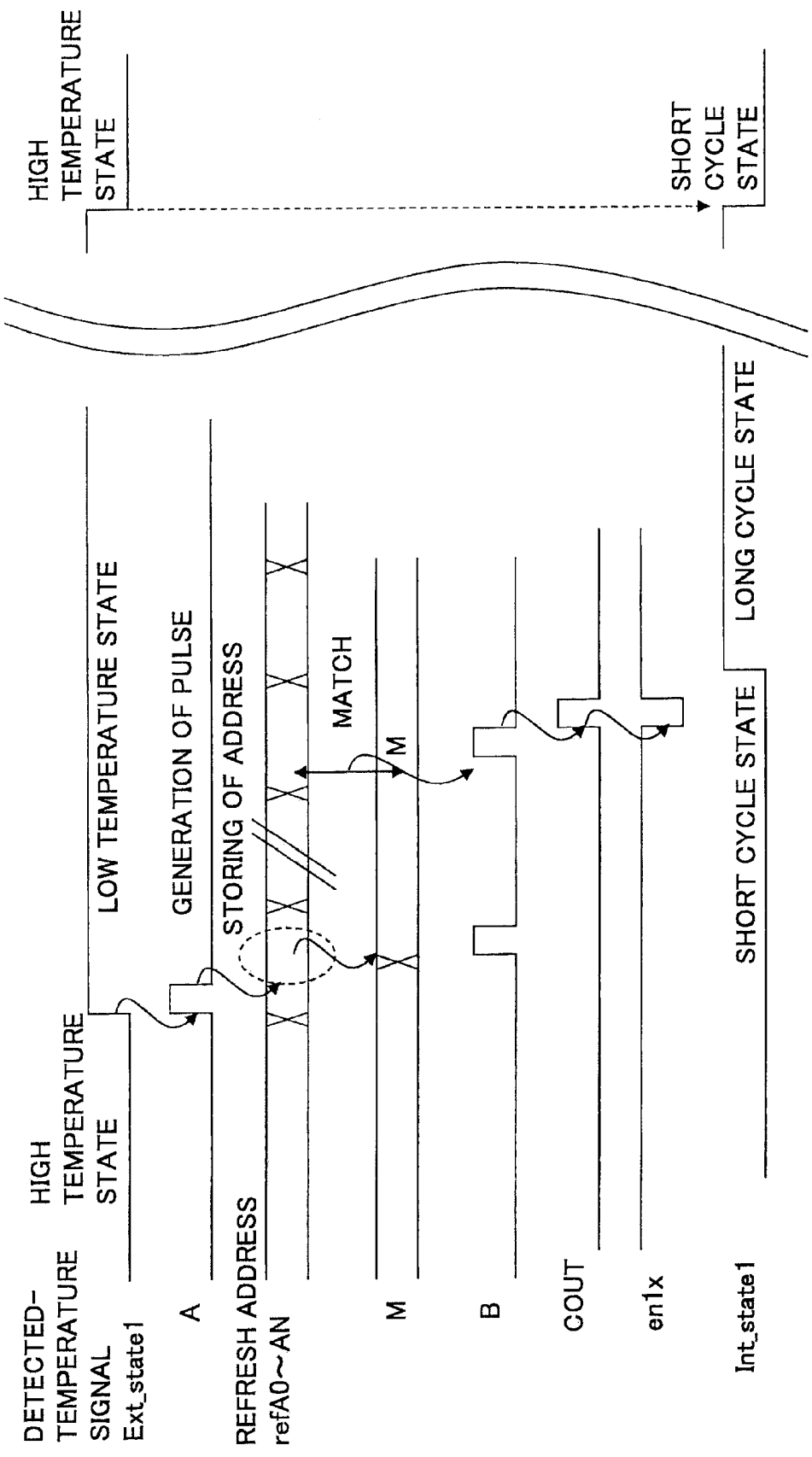
FIG. 13 is a timing chart for explaining an operation of generating frequency-division controlling signals.

FIG. 13 is a timing chart for explaining the operation of generating frequency-division controlling signals.

The detected-temperature signal Ext_state1 changes to HIGH upon a transition from a high temperature state to a low temperature state. Despite this, the frequency-division controlling signal Int_state1 stays LOW. The change to HIGH of the detected-temperature signal Ext_state1, however, results in a HIGH pulse being generated at the node A shown in FIG. 12. The refresh address being supplied at that moment is thus stored at the mode M. At this time, the stored refresh address is compared with the current refresh address (which is the stored refresh address), so that the level of the node B becomes HIGH, indicating a match.

After this, the supplied refresh address loops back after one round, so that the same refresh address as the refresh address stored at the node M is supplied again, resulting in the level of the node B becoming HIGH again. The counter output COUT indicating the count of the HIGH levels of the node B becomes HIGH in response to this second time HIGH. In response, the signal en1x temporarily becomes LOW.

As the signal en1x temporarily stays LOW, the flip-flop comprised of the NOR gates 102 and 103 shown in FIG. 8B inverts its state, so that the frequency-division controlling signal Int_state1 changes to HIGH. As a result, the refresh operation switches from shorter intervals to longer intervals. When a transition from a low temperature state to a high temperature state occurs, on the other hand, the frequency-division controlling signal Int_state1 immediately changes to LOW in response to a change to LOW in the detected-temperature signal Ext_state1.

In the present invention as described above, the refresh intervals are not immediately changed in response to a transition from a high temperature state to a low temperature state. The refresh intervals are changed to longer intervals after storing a refresh address at the time of the detection of the transition and waiting for the next occurrence of the same refresh address. It is thus possible to maintain the refresh intervals that existed prior to the temperature change for at least one cycle of refresh operation (at least one refresh for every memory cell). Provision is thus made to avoid an undesirable event in which switching the refresh intervals to longer intervals causes destruction of data despite a need for shorter-interval refresh operations for the memory cells having been placed in the high temperature state.

The configuration of the counter 178 is not limited to indicate the second-time address match. Provision may alternatively be made to change the output COUT to HIGH in response to a third-time address match or even a later address match. In this case, the refresh intervals are changed to longer intervals after refreshing every memory cell twice or more times rather than after refreshing every memory cell once.

Further, the present invention is not limited to these embodiments, but various variations and modifications may be made without departing from the scope of the present invention.

What is claimed is:

1. A semiconductor memory device which changes a refresh timing when refreshing a memory core having memory cells, comprising:
- a temperature detecting unit configured to supply a temperature-dependent signal that assumes a first state when temperature is higher than a threshold and that assumes a second state when the temperature is lower than the threshold;
- a refresh address generating circuit configured to generate a refresh address in response to a refresh request; and
- a control circuit configured to elongate the refresh timing upon a passage of a certain time following the supply of the temperature-dependent signal by the temperature detecting unit, wherein the control circuit includes:
- a counter circuit that starts counting at a point in time at which the temperature-dependent signal changes from the first state to the second state; and
- a refresh request generating circuit configured to generate the refresh request at a first certain interval before the supply of the temperature-dependent signal, to continue to generate the refresh request at the first certain interval during a period following the supply of the temperature-dependent signal before the counter circuit reaches a certain count value, and to generate the refresh request at a second certain interval different from the first certain interval after the counter circuit reaches the certain count value.

2. The semiconductor memory device as claimed in claim 1, wherein the control circuit generates the refresh timing based on a detected temperature and a signal indicating a start of refresh.

* * * * *